United States Patent [19]

Salmon

[11] 4,075,621
[45] Feb. 21, 1978

[54] HAND HELD COMMUNICATION AID FOR THE DUMB

[75] Inventor: D'Miles E. Salmon, San Jose, Calif.

[73] Assignee: Atari, Inc., Sunnyvale, Calif.

[21] Appl. No.: 739,149

[22] Filed: Nov. 5, 1976

[51] Int. Cl.² .............................................. G06F 3/14
[52] U.S. Cl. ................................... 340/337; 340/311; 340/336; 340/365 R
[58] Field of Search .................... 340/365 R, 311, 337, 340/324 R, 324 M, 336

[56] References Cited

U.S. PATENT DOCUMENTS 3,925,779  12/1975  Gerstenhaber ........................ 340/311
3,976,995  8/1976   Sebestyen ........................... 340/365 R

OTHER PUBLICATIONS

Small Interactive Terminal Has Full ASCII Keyboard; Electronics; 5/16/74; pp. 174, 177.
An Alphanumeric Display as a Communication Aid for the Dumb; Newell et al., Med. & Biol. Eng., Jan. 1975; pp. 84-88.

Primary Examiner—Marshall M. Curtis
Attorney, Agent, or Firm—Flehr, Hohbach, Test, Albritton & Herbert

[57] ABSTRACT

A hand held communication aid for the dumb includes a casing, containing a keyboard, which is easily held in one hand and the keyboard positioned to be operated by the other hand of the user or "speaker". The end of the casing has a visual light emitting diode type alphanumeric display unit facing the reader who would be standing opposite the user. Provision is also made for connecting this unit into a telephone system.

9 Claims, 4 Drawing Figures

HAND HELD COMMUNICATION AID FOR THE DUMB

BACKGROUND OF THE INVENTION

The present invention is directed to a hand held communication aid for the dumb and more particularly to an aid which has an input alpha-numeric keyboard and a visual display.

A communication aid having a hand held keyboard and a light emitting diode display fastened to the lapel of the user or "speaker" is shown in an article in *Medical and Biological Engineering,* January, 1975, Volume 13, No. 1, pages 84–88 entitled "An Alphanumeric Display As A Communication Aid For The Dumb" by A. F. Newell et al. This article in slightly different format has been published in 1976 as Chapter 13 of a book entitled *Aids For The Severely Handicapped* and edited by Keith Copeland. Chapter 13 is entitled "Talking Brooch' Communication Aid", which is a reference to the lapel type display. The book chapter on page 107 discusses the use of "the brooch" in conjunction with standard telephone receivers to form a portable telephone communication system for the deaf or dumb.

The foregoing Newell communication aid while useful still has many defects which reduce its ease of use.

OBJECTS AND SUMMARY OF THE INVENTION

It is a general object of the present invention to provide an improved hand held communication aid for the dumb.

It is a more specific object to provide a communication aid which because of its simplified construction encourages its use by the "speaker" in all situations.

In accordance with the above objects there is provided a communication aid for the dumb comprising an elongated case having a configuration so that it may be securely grasped by one hand. An input alpha-numeric keyboard is included in a surface of the case and oriented to face the user for operation by the other hand. An alphanumber visual display panel actuated by the keyboard is located at an end of the case away from the user, when being held, so that the display is visible and properly oriented for reading by a person standing opposite the user.

DETAILED DESCRIPTION OF THE PREFERRED EMBODIMENTS

Figure 1:
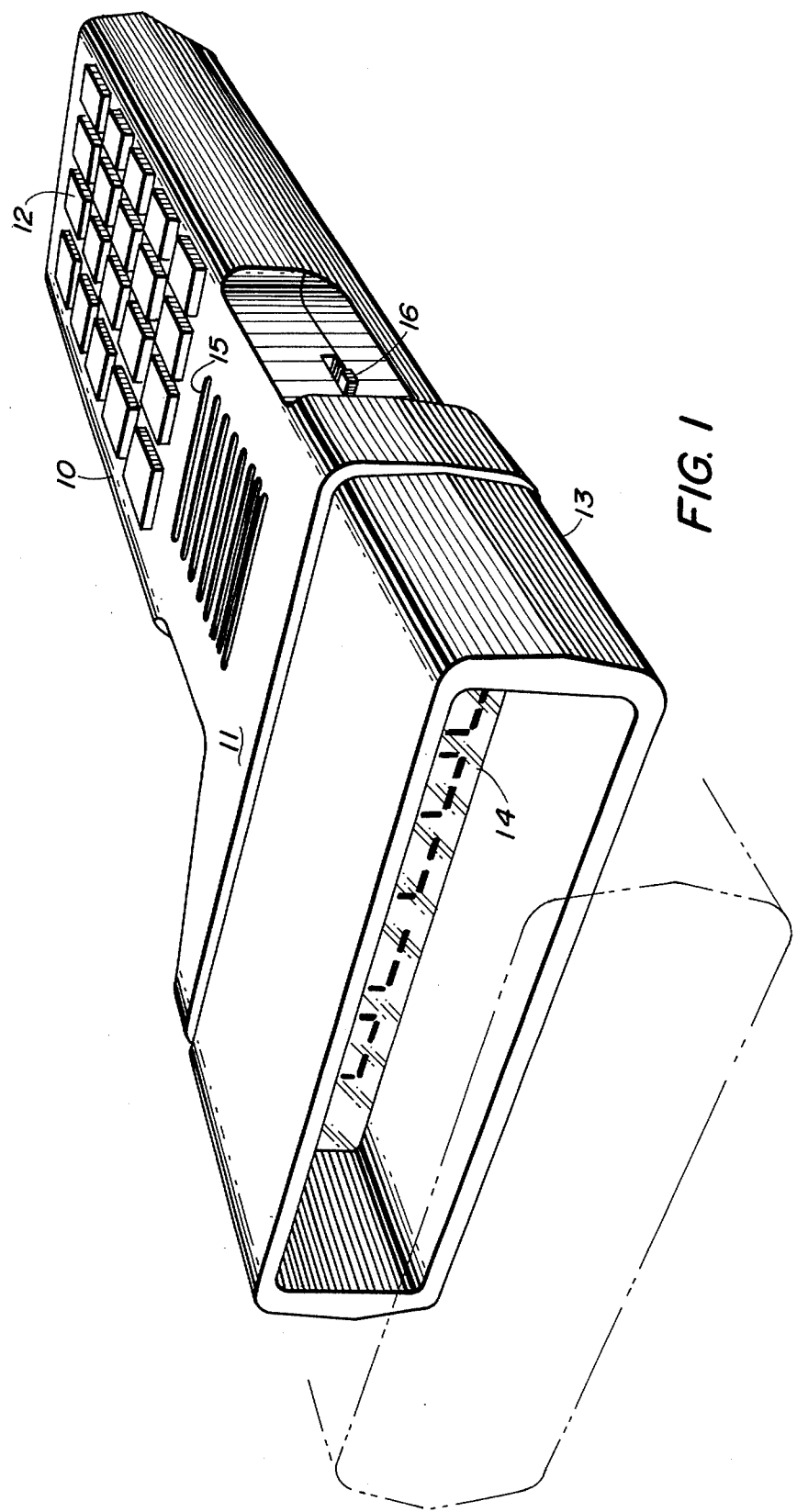
FIG. 1 is a perspective view of a communication aid embodying the present invention.

FIG. 1 is a perspective view of the hand held communication aid of the present invention and includes an elongated case 10 having a configuration suitable to be held by, for example, the left hand of the user or "speaker". Included in the top surface 11 of the case is a 20 key input keyboard 12 which as is apparent from FIG. 1 is oriented for easy operation by the other or right hand of the user. At the enlarged end 13 of case 10, which is the end of the case away from the user when it is being held, is a visual display 14 of light emitting diode type which is illustrated displaying the word "hello". The display 14 by means of the associated elctronic circuitry is of the billboard type where the letters of the message provided by the input keyboard 12 move from right to left each new letter moving in gradually from the right hand end of the display and shifting those present which move off of the display at the left. The 20 keys of alpha-numeric input keyboard 12 are all dual function as provided by a shift button 16. Specifically, in one dual function mode 18 the keys correspond to the letters A through R; in the other mode the same keys correspond to the letters S through Z and the numbers 0 through 9. The two remaining keys provide functions of signal/clear and forward space/back space. Forward space is used to provide a gap in the message and backspace is used to make a correction in a previously displayed character. The clear function clears the display 14 and the signal function (as will be discussed in conjunction with the electrical circuit) provides an audio tone through speaker grille 15 to alert the reader who would normally stand opposite the user or "speaker" that a message is to be delivered by means of the visual display 14.

With the orientation of the visual display at a 90° angle to the surface 11 and keyboard 12 the display is in an optimum orientation to be read by a reader opposite the user and at the same time the keyboard is optimumly oriented for each operation by one hand of the user. The instrument is totally self-contained having its own battery or power supply so that there are no extra wires restricting its use. Thus, the communication aid of the present invention because of its unitary simplified construction encourages its use in all situations. It need only be stored in a pocket, for example, and then retrieved by a single hand and immediately used. By the use of a dual function keyboard the number of keys is also restricted to facilitate the inputing of information for the message.

Figure 2:
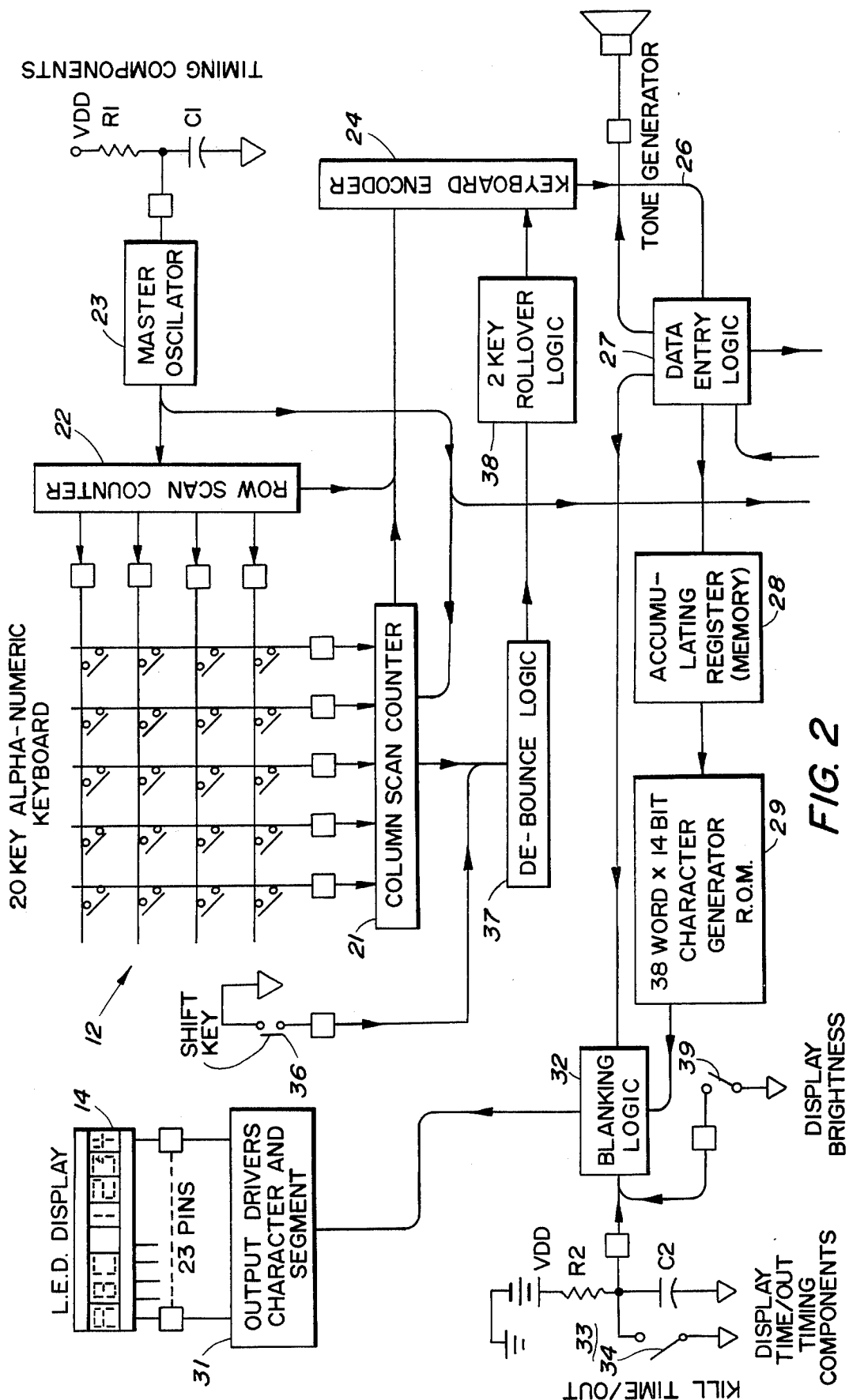
FIGS. 2 and 2A are a circuit diagram of one embodiment of the present invention.
Figure 2A:
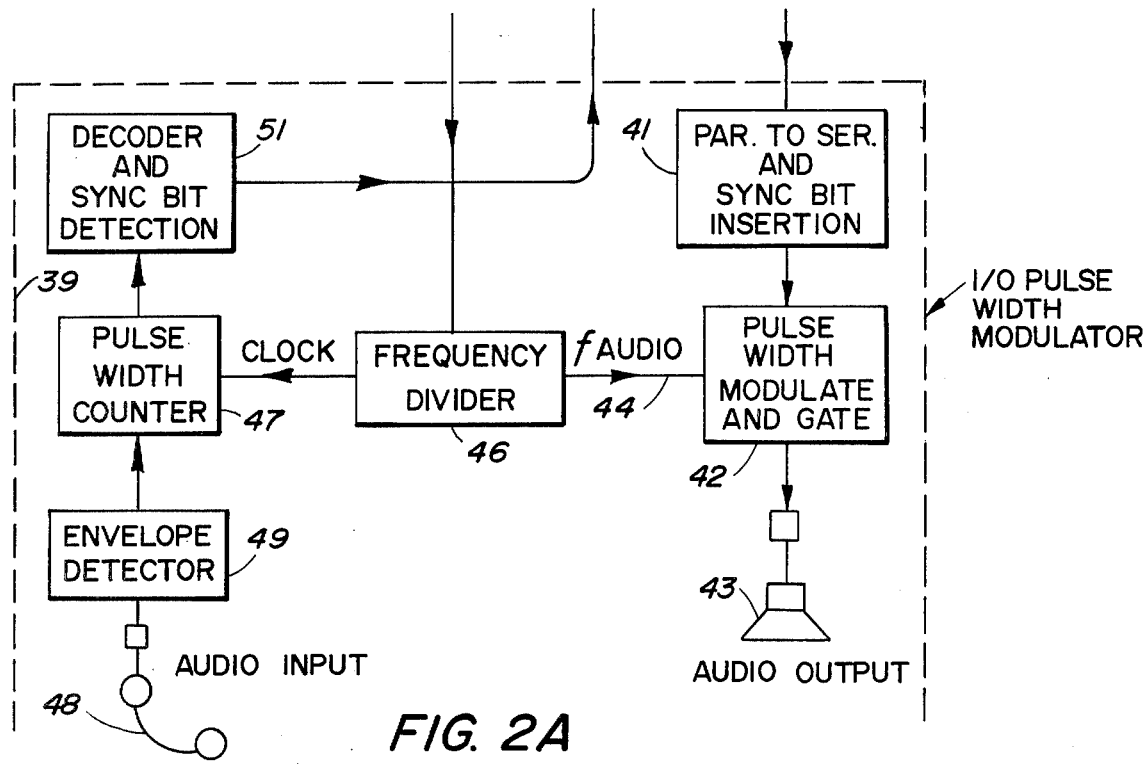

FIG. 2 is a block circuit diagram of the circuitry contained within the case 10 of FIG. 1 and includes the 20 key alpha-numeric keyboard 12 which has its columns and rows scanned by scan counters 21 and 22. A master oscillator 23 provides for appropriate timing. Oscillator 23 is driven by an R1, C1 circuit powered by battery VDD. The column and row information is decoded by a keyboard decoder 24 and converted to a binary or digitally encoded format on output line 26. This digitally encoded keyboard output is processed by data entry logic unit 27 and then the alpha-numeric data is stored in accumulating register 28. This register drives a character read-only memory (ROM) 29 which converts the digitally encoded keyboard output to proper format for driving the light emitting diode display 14. Such display includes the output driver and character segment unit 31. Blanking logic unit 32 responds to the timing circuit generally shown at 33 having an R2, C2 timing circuit which extinguishes the display within three to five seconds if no new character has been entered. Shunting switch 34 eliminates this feature. Timing circuit 33 is again driven by the internal battery VDD. Blanking logic 32 is also driven by an input from data entry logic 27 which responds to, for example, a forward or back space input as well as a clear input from the above described keys. A shift key 36 is connected through keyboard encoder 24 to provide the dual function of each of the 20 keys of the alpha-numeric keyboard.

Finally, in a typical manner de-bounce logic 37 and roll-over logic 38 compensates for malfunctioning or misuse of the keyboard. Also the display brightness switch 39 connected to blanking logic 32 increases the brightness of the light emitting diode display unit 14. This would typically be for outdoor use and could be actuated by movement of a sunshield on display 14 as shown in partial dashed outline.

The communication aid of the present invention may also be connected into a telephone system. To accomplish this the portion of the circuit 39 enclosed by a dashed block is an interface unit for converting the digitally encoded keyboard output into a pulse width modulated format for transmission over the telephone system. Connected to data entry unit 27 is a parallel to serial and synchronization bit insertion unit 41 which drives a pulse width modulating and gating unit 42 which in turn has an audio output 43 which would normally be connected to the transmitter of a telephone handset. The audio frequency is provided at 44 by means of a frequency divider 46 driven by master oscillator 23. This frequency divider also clocks a pulse width counter 47 which receives the audio output 48 from the receiver of the telephone, detects its envelope at 49, and then senses the width of the envelope by means of the counter. This width is decoded by detection unit 51 and then drives the LED display 14 through data entry logic unit 27.

Figure 3:
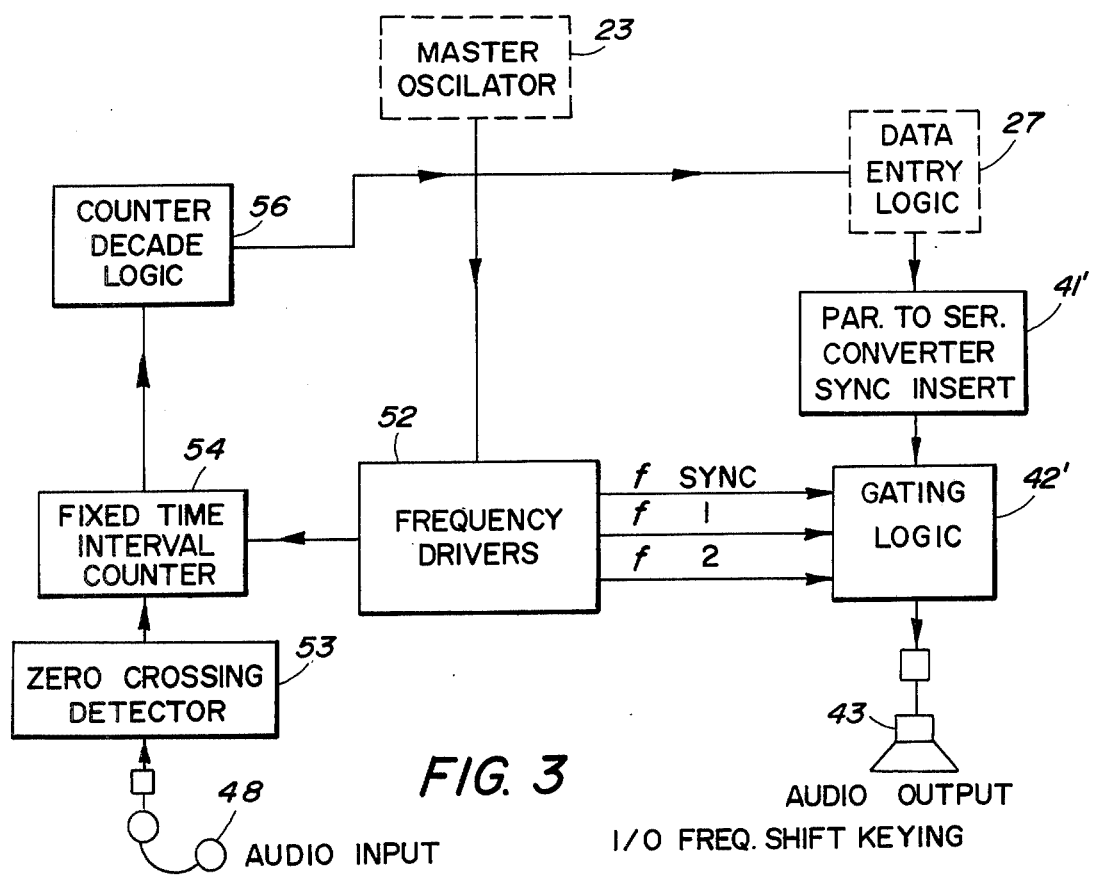
FIG. 3 is a circuit block diagram showing another embodiment of the invention.

The input/output or interface unit for use with the telephone system may also be constructed on a frequency shift keying basis as illustrated in FIG. 3. Here the digitally encoded keyboard output from data entry logic 27 drives insertion unit 41' and gating logic 42' to in turn drive the audio output 43. Frequency driver unit 52 is driven by master oscillator 23 and provides three different frequencies for the gating logic 42' in accordance with well-known frequency shift keying techniques. From the receiving side, audio input 48 has its zero crossing detected by unit 53 which drives the fixed time interval counter 54 and in turn is connected to decade logic unit 56 and then to the data entry logic unit 27.

Both of the input/output units for interfacing the telephone system described above may either be incorporated in the case 10 of the hand held communicator of FIG. 1 or attached to a telephone unit with the appropriate coupling to the remaining necessary components of the hand held unit which would include, of course, the master oscillator 23 and an output from data entry logic unit 27.

Thus, an improved communication aid for the dumb has been provided.

What is claimed is:

1. A communication aid for the dumb comprising: a case having an elongated portion and an enlarged portion said portions constituting a substantially co-planar top surface of said case said elongated portion being configured so that it may be securely grasped by one hand and with an input alpha-numeric keyboard included in said top surface of said elongated portion oriented to face the user for operation by the other hand, said enlarged portion including an alpha-numeric visual display panel actuated by said keyboard located at an end of said enlarged portion of said case away from the user and oriented at a 90° angle with respect to said top surface in which said keyboard is included so that the display is visible and properly oriented for reading by a person standing opposite the user; and a power supply contained within said case.

2. An aid as in claim 1 including means for interfacing said keyboard with a telephone system.

3. An aid as in claim 2 where said interface means includes means for converting a digitally encoded keyboard output into a pulse width modulated format for transmission over said telephone system.

4. An aid as in claim 2 where said interface means includes means for converting a digitally encoded keyboard output into a frequency shift keying format for transmission over said telephone system.

5. An aid as in claim 1 including an audio transducer mounted in said case and responsive to actuation of a predetermined key of said keyboard.

6. An aid as in claim 1 including means for increasing the brightness of said visual display.

7. An aid as in claim 1 including a shift key for providing dual functioning for said alpha-numeric keyboard.

8. An aid as in claim 1 wherein said alpha-numeric keyboard in one mode of operation includes input keys corresponding to the letters A through R and in its other dual function mode the letters S through Z and the numbers 0 through 9.

9. An aid as in claim 8 where said keyboard consists of twenty keys one of said keys providing SIGNAL/CLEAR dual functions and another FORWARD-SPACE/BACK-SPACE dual finctions.

* * * * *